US006984581B2

(12) United States Patent
Wong

(10) Patent No.: US 6,984,581 B2
(45) Date of Patent: Jan. 10, 2006

(54) STRUCTURAL REINFORCEMENT OF HIGHLY POROUS LOW K DIELECTRIC FILMS BY ILD POSTS

(75) Inventor: Lawrence D. Wong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 09/745,705

(22) Filed: Dec. 21, 2000

(65) Prior Publication Data

US 2002/0079583 A1 Jun. 27, 2002

(51) Int. Cl.
H01L 21/4763 (2006.01)
H01L 21/31 (2006.01)

(52) U.S. Cl. ............... 438/623; 438/626; 438/631; 438/645; 438/780

(58) Field of Classification Search ........ 438/622–624, 438/626, 627, 629, 631, 637, 643, 645, 653, 438/780–782; 257/642, 643, 751–753, 758–760, 257/762, 773, 774
See application file for complete search history.

(56) References Cited

U.S. PATENT DOCUMENTS

| | | | |
|---|---|---|---|
| 5,470,802 A * | 11/1995 | Gnade et al. ............ 438/781 |
| 5,789,819 A | 8/1998 | Gnade et al. |
| 5,858,871 A | 1/1999 | Jeng |
| 5,900,072 A * | 5/1999 | Jun ..................... 148/33.3 |
| 5,965,939 A | 10/1999 | Kim et al. |
| 6,109,775 A | 8/2000 | Tripathi et al. |
| 6,140,252 A * | 10/2000 | Cho et al. ............... 438/781 |
| 6,156,660 A | 12/2000 | Liu et al. |
| 6,297,554 B1 * | 10/2001 | Lin ..................... 257/752 |
| 6,429,117 B1 | 8/2002 | Sudijono et al. |
| 6,432,811 B1 * | 8/2002 | Wong ..................... 438/619 |
| 6,610,592 B1 | 8/2003 | Shue et al. |

FOREIGN PATENT DOCUMENTS

| | | |
|---|---|---|
| JP | 10-189716 A | 7/1998 |
| WO | WO 0024050 A | 4/2000 |

OTHER PUBLICATIONS

International Search Report PCT/US 01/44662.
International Preliminary Examining Authority PCT/US01/44662.

* cited by examiner

Primary Examiner—Hung Vu
(74) Attorney, Agent, or Firm—Blakely, Sokoloff, Taylor and Zafman

(57) ABSTRACT

Highly porous, low-k dielectric materials are mechanically reinforced to enable the use of these low-k materials as interlayer dielectrics in advanced integrated circuits such as those which incorporate highly porous ILD materials in a Cu damascene interconnect technology. An integrated circuit, embodying such a mechanically reinforced ILD generally includes a substrate having interconnected electrical elements therein, a first dielectric layer disposed over the substrate, a plurality of electrically insulating structures disposed on the first dielectric layer, and a second dielectric layer disposed on the first dielectric layer such that the second dielectric surrounds the plurality of structures. A process, for making a mechanically reinforced, highly porous, low-k ILD, generally includes forming a first dielectric layer on a substrate, patterning the first dielectric layer such that a plurality of structures are formed, the structures each having a top surface, forming a second dielectric layer over and adjacent to the structures, the second dielectric layer having a top surface, and polishing the second dielectric layer such that its top surface is substantially even with the top surfaces of the structures. The structures may be rectangular posts, or more geometrically complex forms. The structures may be identical, or a combination of various forms.

11 Claims, 6 Drawing Sheets

FORM AT LEAST ON VERTICALLY-ORIENTED NON-CONDUCTIVE REINFORCING STRUCTURE ON A SUBSTRATE — 702

FORM A DIELECTRIC LAYER SURROUNDING THE REINFORCING STRUCTURE — 704

*FIG. 11*

```
┌─────────────────────────────────────────────┐
│ FORM A FIRST DIELECTRIC LAYER OVER METAL    │──802
│ CONDUCTORS AND AN INTRALAYER DIELECTRIC     │
└─────────────────────────────────────────────┘

┌─────────────────────────────────────────────┐
│ FORM A SECOND SECOND DIELECTRIC LAYER OVER THE FIRST │──804
│              DIELECTRIC LAYER               │
└─────────────────────────────────────────────┘

┌─────────────────────────────────────────────┐
│ PATTERN THE SECOND DIELECTRIC LAYER TO FORM │──806
│          REINFORCING STRUCTURES             │
└─────────────────────────────────────────────┘

┌─────────────────────────────────────────────┐
│ FORM A THIRD DIELECTRIC LAYER OVER AND ADJACENT │──808
│         THE PATTERNED SECOND DIELECTRIC     │
└─────────────────────────────────────────────┘

┌─────────────────────────────────────────────┐
│        PLANARIZE THE THIRD DIELECTRIC LAYER │──810
└─────────────────────────────────────────────┘

┌─────────────────────────────────────────────┐
│ FORM INLAID METAL INTERCONNECTION IN THE THIRD DIELECTRIC LAYER │──812
└─────────────────────────────────────────────┘
```

STRUCTURAL REINFORCEMENT OF HIGHLY POROUS LOW K DIELECTRIC FILMS BY ILD POSTS

BACKGROUND OF THE INVENTION

1. Field of the Invention

The present invention relates generally to microelectronic structures and fabrication methods, and more particularly to the formation of integrated circuit insulation having low dielectric constants.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as silicon dioxide.

A consequence of having of patterned conductive material separated by an insulating material, whether the conductive material is on a single level or multiple levels, is the formation of undesired capacitors. The parasitic capacitance between patterned conductive material, or more simply, interconnects, separated by insulating material on microelectronic devices contributes to effects such as RC delay, unnecessary power dissipation, and capacitively coupled signals, also known as cross-talk.

One way to reduce the unwanted capacitance between the interconnects is to increase the distance between them. Increased spacing between interconnect lines has adverse consequences, such as increased area requirements and the corresponding increases in manufacturing costs. Another way to reduce the unwanted capacitance between the interconnects is to use an insulating material with a lower dielectric constant.

What is needed is a structure providing low parasitic capacitance between patterned conductors, and methods of making such a structure.

BRIEF DESCRIPTION OF THE DRAWINGS

FIG. 11 is a flow diagram illustrating a process in accordance with the present invention.

FIG. 12 is a flow diagram illustrating an alternative process in accordance with the present invention.

DETAILED DESCRIPTION

Figure 1:
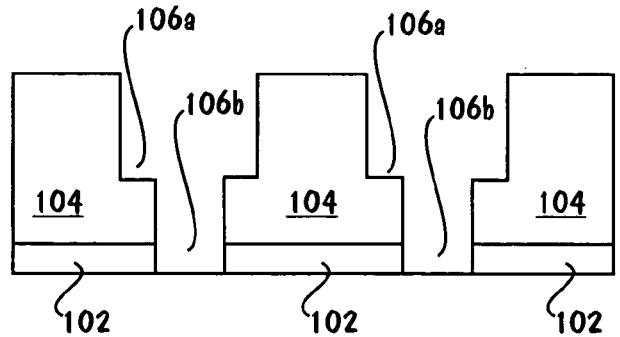
FIG. 1 is a schematic cross-section of a partially processed substrate showing a dual damascene opening formed in a composite interlayer dielectric having first and second layers in accordance with a prior art method.

Mechanically reinforced interlayer dielectric structures and methods of manufacturing such structures are described. Such mechanically reinforced interlayer dielectric structures are useful for, at least, integrated circuits having highly porous low-k interlayer dielectrics. In the following description, numerous specific details are set forth to provide an understanding of the present invention. It will be apparent however, to those skilled in the art and having the benefit of this disclosure, that the present invention may be practiced with apparatus, compositions, and processes that vary from those specified herein.

Reference herein to "one embodiment", "an embodiment", or similar formulations, means that a particular feature, structure, or characteristic described in connection with the embodiment is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Terminology

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), cobalt (Co), nickel (Ni), tungsten (W), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure, contact and via refer to the completed structure.

Dishing, as used herein, refers to an amount of material, typically the metal of a metal damascene structure, that is removed during the polishing of the metal damascene structure. Dishing is similar to recess in that it represents an overpolishing of the metal (i.e., excess material removal), however dishing typically results in a parabolic or concave shaped metal surface and is due to a mechanical interaction as the polish pad bends into the damascene structure. Dishing is measured as a thickness, or distance, and more particularly, it is a measure of the distance between the post-polish surface of the interlayer dielectric and the post-polish surface of the metal.

Erosion, as used herein, refers to the amount of a layer, typically an interlayer dielectric, that is removed during the polishing of a metal damascene structure. Erosion is measured as a thickness, or distance, and more particularly, it is a measure of the distance between the original surface of the layer and its post-polish surface. Erosion is generally an undesirable result of overpolishing.

The expression, low dielectric constant material, refers to materials having a lower dielectric constant than silicon dioxide. For example, organic polymers, amorphous fluorinated carbons, nanofoams, silicon based insulators containing organic polymers, carbon doped oxides of silicon, and fluorine doped oxides of silicon have lower dielectric constants than silicon dioxide.

The letter k, is often used to refer to dielectric constant. Similarly, the terms high-k, and low-k, are used in this field to refer to high dielectric constant and low dielectric constant respectively. High and low are relative to the dielectric constant of $SiO_2$.

The term intralayer dielectric as used in this field is understood to refer to the dielectric material disposed between interconnect lines on a given interconnect level. That is, an intralayer dielectric is found between adjacent interconnect lines, rather than vertically above or below those interconnect lines.

The term vertical, as used herein, means substantially perpendicular to the surface of a substrate.

Highly porous, low-k ILD (inter-layer dielectric) materials having desirable electrical characteristics are provided with mechanically reinforcing structures to provide the additional strength for withstanding subsequently occurring, physically demanding process operations. Such process operations include, but are not limited to, those encountered in damascene metallization processes.

The parasitic capacitance seen by an interconnect line is a function of the distance to another conductor and the dielectric constant of the material therebetween. However, increasing the spacing between interconnect lines increases the physical size, and thus the cost, of an integrated circuit. Therefore, in order to manufacture integrated circuits with low parasitic capacitance between interconnect lines, it is desirable to electrically isolate the conductors from each other with an insulator having a low dielectric constant.

One way to reduce the adverse effects of parasitic capacitance (e.g., RC interconnect delay) is to, as mentioned above, use low-k materials as insulators in advanced microelectronics products (e.g., integrated circuits). To achieve low dielectric constants, a manufacturer can either use a material which inherently possesses a low dielectric constant, and/or the manufacturer can introduce porosity into the material. Unfortunately, by increasing the film void fraction, which may be referred to as porosity, the thermal-mechanical properties of the material may be degraded.

Process integration of a highly porous ILD film in a Cu damascene interconnect structure is a demanding challenge. For instance, the application of chemical mechanical polishing (CMP) to remove excess Cu in a damascene metallization process can induce mechanical failures which result in delamination or tearing of the underlying ILD films. Control of both the erosion and dishing of the Cu lines will strongly determine the amount of shear imposed to these weaker ILD materials. Similarly, packaging can subject interconnect layers to severe shear and normal forces. Workarounds have been devised to improve the robustness of the porous ILD layers with respect to the stresses introduced by the CMP of Cu. One example workaround is to introduce "dummy" metal features at the trench level to improve CMP uniformity (i.e., reduce over-polish by creating uniform clearing between dense and non-dense line features). Inclusion of so-called "dummification" features at the via layers are a more challenging task due to limitations of creating redundant vias as heat sinks to control metal self-heating.

In accordance with the present invention, highly porous materials can be integrated into a Cu damascene interconnect structure. In one embodiment of the present invention, a process flow includes the formation of ILD posts (alternatively referred to as pillars) through the via and metal layers which provide mechanical reinforcement of an ILD stack. These posts may also act as thermal conduits for improved heat removal. However, because the posts typically have a dielectric constant that is greater than the dielectric constant of the porous low-k dielectric, the tradeoff in capacitance effects depends upon the placement of the posts and their material composition.

Creation of mesoporous (nanoporous) low-k materials can be achieved by several known methods. For example, such porous films can be engineered as aerogels/xerogels (by sol-gel, templating processes, CVD, etc.) with either open or closed pore structures. In such films the pore radius and void fraction can be modulated by the choice of precursors and conditioning techniques. Because the mechanical strength of a film tends to decrease as porosity is increased, processes such as e-beam, or UV flood exposure, have been developed to increase the mechanical strength (such as hardness/modulus, or fracture toughness) of the film. However, these processes can degrade the film dielectric constant (i.e., increase the dielectric constant) by increasing the film density or the extent of cross-linking in the low-k material. Additionally, films that are highly porous may not even be susceptible to sufficient film strengthening by these processes.

Figure 2:
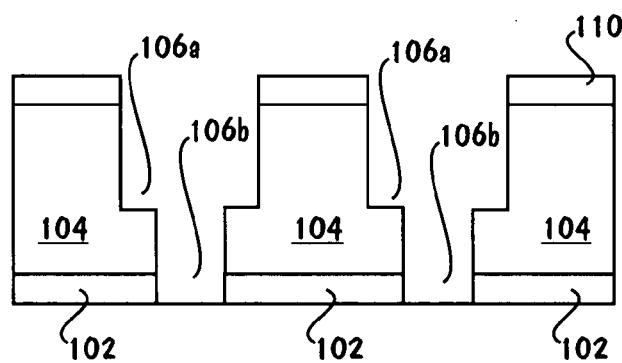
FIG. 2 is a schematic cross-section of a partially processed substrate showing a dual damascene opening formed in a composite interlayer dielectric having first, second, and third layers in accordance with a prior art method.
Figure 3:
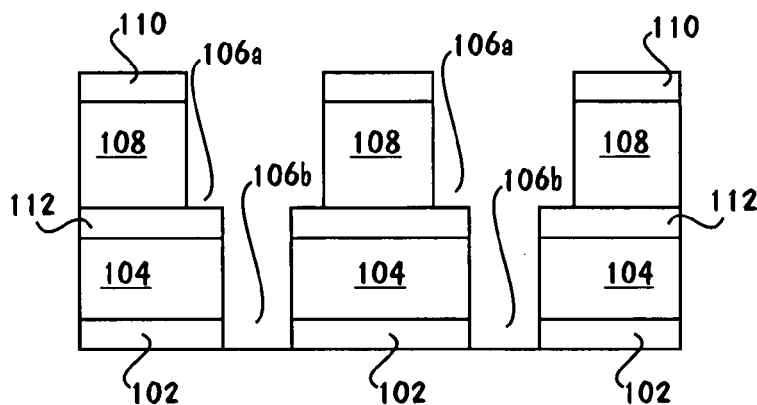
FIG. 3 is a schematic cross-section of a partially processed substrate showing a dual damascene opening formed in a composite interlayer dielectric having first, second, third, fourth, and fifth layers in accordance with a prior art method.

FIGS. 1–3 illustrate problematic approaches to providing a low-k insulating material between interconnect lines formed in a damascene process. FIG. 1 shows a carbon doped oxide (CDO) of silicon which, while possessing a dielectric constant less than that of silicon dioxide, does not provide the same level of improvement as do various polymer dielectrics and highly porous dielectric materials. With respect to FIGS. 2 and 3, the bulk of the dielectric layer is comprised of a spin-on polymer, or other type of low-k dielectric such as a highly porous material, and the remainder of the dielectric layer is comprised of one more relatively thin layers of alternative dielectric material. In each of the structures shown in FIGS. 2 and 3, there is limited resistance to lateral shearing forces, such as may be encountered during various integrated circuit manufacturing processes.

In an illustrative embodiment of the present invention, silicon dioxide posts, are used to provide mechanical reinforcement of the comparatively weak, highly porous dielectric material which makes up the bulk of the ILD. More particularly, these oxide posts provide the mechanical strength necessary to stand up to the stresses created by chemical mechanical polishing. It should be noted that the composition of the posts is not limited to silicon dioxide, although oxides of silicon are typical, including those oxides that are doped with fluorine, carbon, or both.

Figure 4:
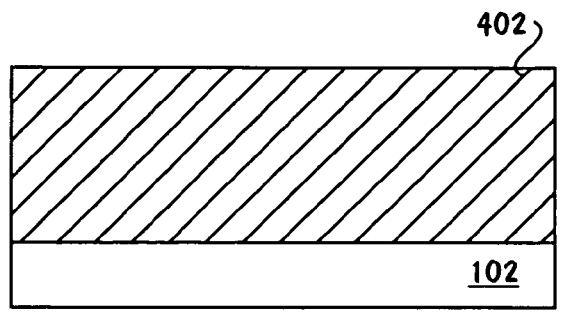
FIG. 4 is a schematic cross-section of a partially processed substrate having a first dielectric layer, and a second dielectric layer.

Referring to FIG. 4, a cross-section of a partially processed wafer is shown including a first dielectric layer 102 and a second dielectric layer 402. FIG. 4, does not show the underlying portion of the substrate in which various circuit elements such as transistors are formed. Those skilled in the art and having the benefit of this disclosure will appreciate that the formation of such circuit elements is well known and their formation and structure will not be described further. First dielectric layer 102 is typically formed over an underlying ILD layer, and be made from materials such as, but not limited to, silicon carbide, silicon nitride, or carbon doped oxides of silicon. First dielectric layer 102 may be formed over an ILD layer in which metal filled trenches and vias have previously been formed. Second dielectric layer 402 is formed of a material that has greater mechanical strength than that possessed by highly porous low-k dielectric materials. In one embodiment, second dielectric layer 402 is made of silicon dioxide.

Figure 5:
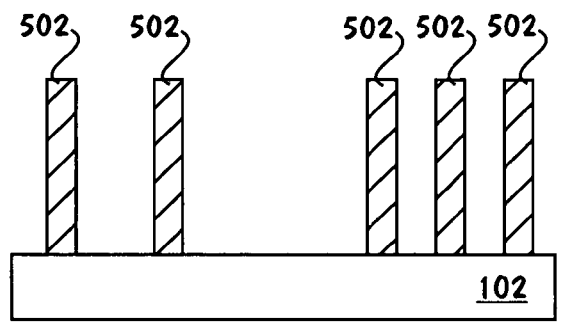
FIG. 5 is a schematic cross-section the structure of FIG. 4, after the second dielectric layer has been patterned to produce a plurality of posts.

Referring to FIG. 5, the structure of FIG. 4 is shown after second dielectric layer 402 has been patterned to form ILD posts 502. These posts may alternatively be referred to as pillars. Although shown as posts in the illustrated embodiment, various other structures may be patterned, including but not limited to structures such as walls or crosses, as shown in top view in FIG. 6. Methods for patterning silicon dioxide are well known in this field and may include the conventional operations of forming a layer of photoresist over second dielectric layer 402, exposing and developing the photoresist, and etching the exposed portions of second dielectric layer 402 to form posts 502 As shown in FIG. 5, the posts have vertical sidewalls indicating an anisotropic etch. However, the invention is not limited to formation of posts 502, or other reinforcing structures, by an anisotropic etch. Mechanical reinforcement structures may also be formed by isotropic etch, or a combination of isotropic and anisotropic etch operations. Those skilled in the art will recognize that isotropic etch chemistries will produce reinforcing structures having tapered, i.e., sloping sidewalls. The locations of posts 502 are selected based, at least in part, on where the interconnect lines and vias are to be formed. That is, the locations of posts 502 are selected so as to not interfere with the formation of interconnect lines and vias. This selection process is useful regardless of whether a damascene metal process or a subtractive metal process is used.

Figure 6:
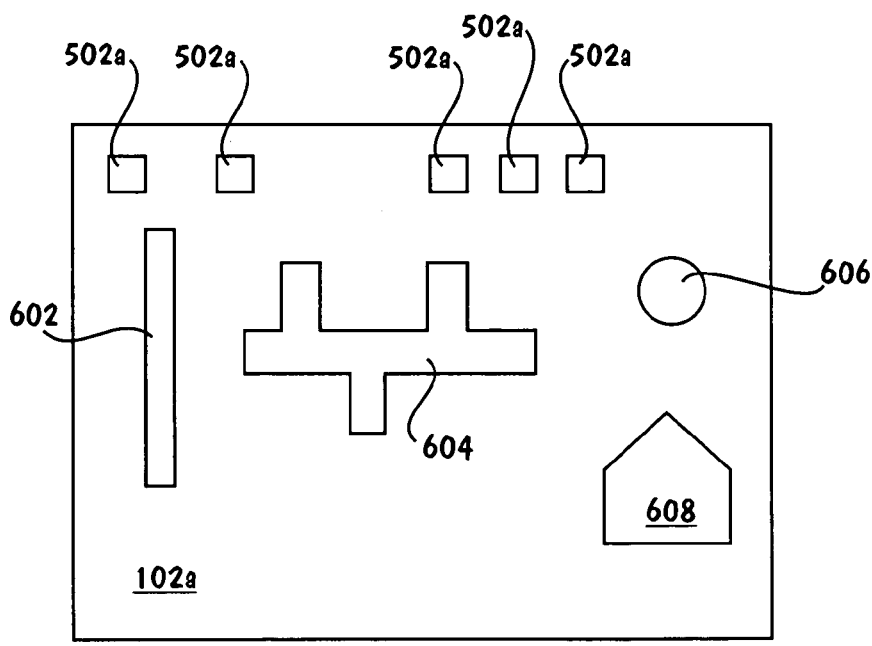
FIG. 6 is a schematic top view of exemplary alternative reinforcement structures in accordance with the present invention.

Referring to FIG. 6, several alternative reinforcing structures in accordance with the present invention are shown. A top view of ILD posts 502 are shown as top surfaces 502a. A top surface 602 corresponds to a wall, or fence-like, structure. Top surface 604 corresponds to a reinforcing structure in the shape of a complex polygon. Top surface 606 corresponds to an ILD post that is cylindrical. Top surface 608 corresponds to yet another alternative embodiment of a reinforcing structure. It will be apparent to those skilled in the art and having the benefit of this disclosure that the reinforcing structures of the present invention are not limited to any particular shape.

Figure 7:
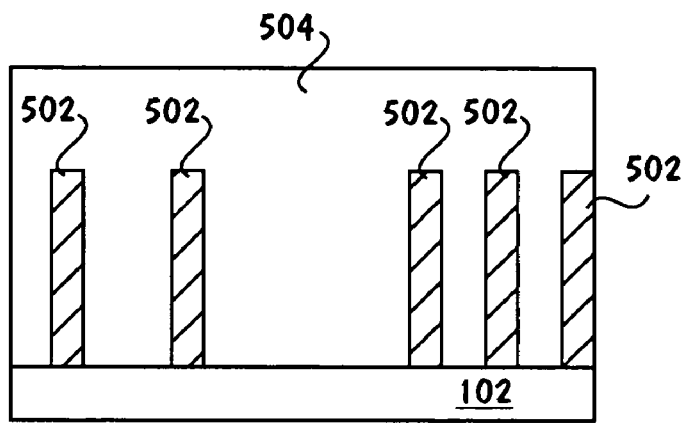
FIG. 7 is a schematic cross-section of the structure of FIG. 5, after a third dielectric layer has been formed over and around the posts.

Referring to FIG. 7, it can be seen that subsequent to the formation of posts 502, a layer of low-k dielectric film 504 is formed over and around posts 502. In the illustrated example, film 504 is a porous film such as a mesoporous $SiO_2$, or a polymer, and has a dielectric constant in the range of 1.2 to 2.8. Formation of low-k film 504 may be achieved by depositing material either by chemical vapor deposition (CVD) or by spin-on techniques.

Figure 8:
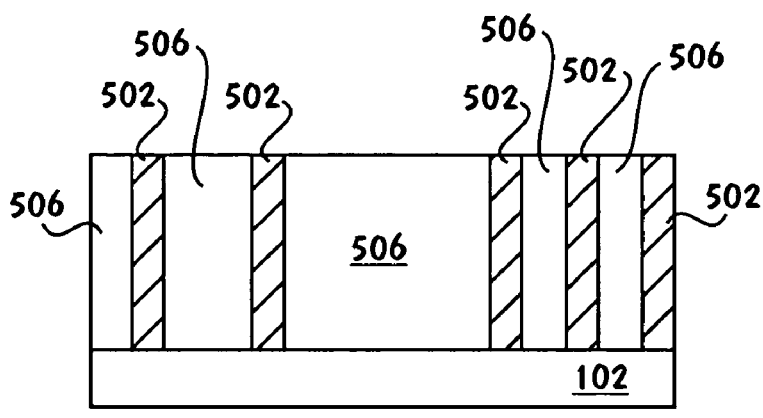
FIG. 8 is a schematic cross-section of the structure of FIG. 6, after the third dielectric layer has been planarized.

FIG. 8 shows the structure of FIG. 7, after chemical mechanical polishing has been performed to produce dielectric layer 506 by planarizing the surface of dielectric layer 504. Typically, the post-polish height of layer 506 is substantially equal to the height of posts 502. In other words, the post-polish top surface of layer 506 is in the plane of, or within manufacturing tolerances of the plane of the top surface of ILD posts 502. It will be understood that because of the different physical properties of the materials which comprise the posts and the materials which comprise the surrounding dielectric layer, the vertical distances between the top surfaces of the posts and the top surfaces of the dielectric layer may, if so desired, be adjusted to some extent by the polishing process.

Optionally, dielectric layer 504 may be subjected to an aging or a curing process in order to increase its porosity. The increased porosity is desirable to reduce the parasitic capacitance between electrical nodes in the integrated circuit which is being manufactured. Posts 502 provide the mechanical strength and stability to withstand the forces encountered during processing steps such as CMP.

Figure 9:
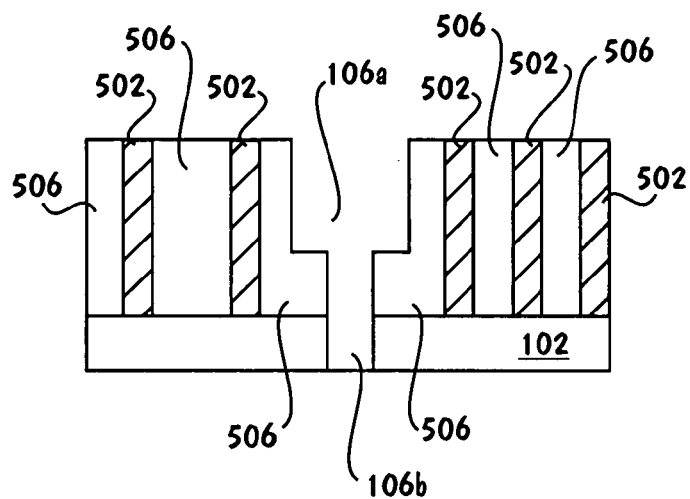
FIG. 9 is a schematic cross-section the of the structure of FIG. 7, after dual damascene openings have been etched in the third dielectric layer.

FIG. 9 shows the structure of FIG. 8, after trench opening 106a, and via opening 106b have been etched into dielectric layer 506. Trench opening 106a and via opening 106b are consistent with the damascene method of forming metal interconnections. The patterning of these damascene trench and via openings is well-documented in the literature of this field and will not be described in greater detail herein.

Figure 10:
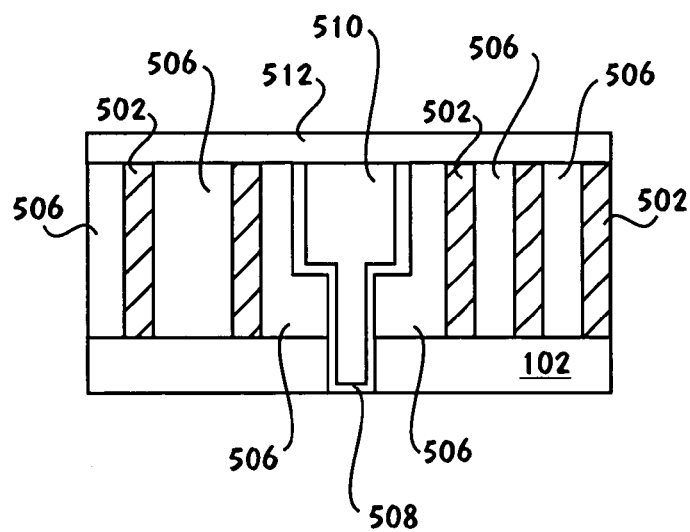
FIG. 10 is a schematic cross-section of the structure of FIG. 8 after the dual damascene openings have had a copper diffusion barrier formed therein, copper metal has been plated thereon, excess copper has been removed and an etch stop/barrier layer has been formed over the copper, and third dielectric layer.

FIG. 10 shows the structure of FIG. 9, after a copper diffusion barrier 508 is formed upon the surfaces of trench opening 106a and via opening 106b. Various copper diffusion barriers, some electrically conductive and others electrically non-conductive are known. In the illustrated embodiment, copper diffusion barrier 508 is formed of TiNSi. It should be noted that other materials, including but not limited to, TiN, TaN and Ta may be used. A copper seed layer is formed over barrier 508 and copper 510 is deposited (i.e., plated) so as to fill via opening 106b and trench opening 106a. Excess copper is removed by chemical mechanical polishing and an etch stop/barrier layer 512 is formed over posts 502, porous low-k dielectric 506, diffusion barrier 508, and copper 510. Etch stop/barrier layer 512 may be formed of a material such as, but not limited to, silicon carbide, silicon nitride, and carbon doped oxides of silicon.

FIGS. 11–12 are flow diagrams showing processes in accordance with the present invention. FIG. 11 illustrates a method of forming a dielectric layer having mechanically reinforcing structures embedded therein. FIG. 12 illustrates a method of forming interconnects on an integrated circuit, including forming a dielectric layer having reinforcing structures therein.

FIG. 11 illustrates a method in which at least one vertically-oriented non-conductive reinforcing structure is formed on a substrate (702). As indicated above, silicon dioxide posts may be patterned by conventional photolithographic methods. A dielectric layer, typically a mechanically weak material, such as, but not limited to, a highly porous material, is disposed between the reinforcing structures (704). The posts, or reinforcing structures having other shapes, may be formed from materials other than silicon dioxide, as long as they provide the mechanical reinforcement needed to give strength to the subsequently formed dielectric layer.

FIG. 12 illustrates a process including forming a first dielectric layer over metal conductors and an intralayer dielectric (802). This is typically accomplished by forming a copper diffusion barrier over of Cu damascene interconnect level. A second dielectric layer is then formed over the first dielectric layer (804). This second dielectric layer is the one from which mechanically, or structurally, reinforcing members are constructed. The construction of mechanically reinforcing members, or structures, is accomplished in this illustrative embodiment by patterning the second dielectric layer (806). A third dielectric layer is then formed over and adjacent the patterned second dielectric layer (808). This third dielectric layer is typically of a material that provides a lower dielectric constant than that of the second dielectric material. However, the third dielectric layer is also mechanically weaker than the material of the second dielectric. In this illustrative embodiment of the present invention, the third dielectric layer is then planarized such that its top surface is substantially even with the top surface of the patterned second dielectric layer (810). Inlaid metal interconnections are then formed in the third dielectric layer in accordance with known damascene metallization techniques (812).

Conclusion

In general, embodiments of the present invention provide low dielectric constant insulators on integrated circuits. Methods, in accordance with one aspect of the present invention, permit integration of highly porous ILD materials into a Cu damascene interconnect manufacturing flow by providing ILD posts through the via and metal layers which in turn provide mechanical reinforcement of the ILD stack.

An advantage of some embodiments of the present invention is that low dielectric constants insulators having the necessary mechanical strength to withstand subsequent processing, such as for example, chemical mechanical polishing are obtained.

A further advantage of some embodiments of the present invention is that the reinforcing structures provide a greater degree of thermal conduction than is possible with the highly porous ILD alone. Because of this, the reinforcing structures may also benefit an integrated circuit in terms of conducting heat away from the active circuit elements such as transistors.

The present invention may be implemented with various changes and substitutions to the illustrated embodiments. For example, the present invention may be implemented on substrates comprised of materials other than silicon, such as, for example, gallium arsenide or sapphire. Similarly, the present invention may be implemented with various alloys of copper forming the metal interconnect lines.

It will be readily understood by those skilled in the art that various other changes in the details, materials, and arrangements of the parts and operations which have been described and illustrated in order to explain the nature of this invention may be made without departing from the principles and scope of the invention as expressed in the subjoined Claims.

What is claimed is:

1. A process, comprising:
    forming a first dielectric layer on a substrate, wherein the first dielectric layer has a dielectric constant;
    patterning the first dielectric layer such that a plurality of vertically oriented posts are formed on the substrate, the posts having a top surface;
    forming a second dielectric layer over and adjacent to the posts, the second dielectric layer having a top surface and substantially filling up the area adjacent to said posts, wherein the second dielectric layer has a dielectric constant, said dielectric constant of the first layer being higher than said dielectric constant of the second layer;
    wherein said plurality of vertically oriented posts are used to provide mechanical reinforcement of the second dielectric layer which makes up the bulk of an inter-layer dielectric material;
    polishing the second dielectric layer such that its top surface is substantially even with the top surfaces of the posts; and
    after forming the second dielectric layer, forming an inlaid metal interconnection in the second dielectric layer.

2. The process of claim 1, wherein the substrate comprises a dielectric material.

3. The process of claim 1, wherein the substrate is a material selected from the group consisting of silicon carbide, silicon nitride, and carbon doped oxides of silicon.

4. The process of claim 1, further comprising curing the second dielectric layer.

5. The process of claim 1, further comprising aging the second dielectric layer.

6. The process of claim 1, further comprising forming dual damascene openings in the second dielectric layer.

7. The process of claim 1, wherein forming the first dielectric layer comprises depositing an oxide of silicon.

8. The process of claim 7, wherein forming the second dielectric layer comprises chemical vapor deposition of a low-k material.

9. The process of claim 7, wherein forming the second dielectric layer comprises spinning on a low-k material.

10. A process, comprising:
    depositing a silicon nitride layer on a substrate;
    depositing an insulating layer over the silicon nitride layer, wherein the insulating layer has a dielectric constant;
    patterning the insulating layer such that a plurality of structures are formed, the structures each having a top surface;
    depositing a porous dielectric material over and adjacent to the structures, the porous dielectric material having a void fraction, wherein the porous dielectric material substantially fills out the area adjacent to said structures and wherein the porous dielectric material has a dielectric constant, said dielectric constant of the insulating layer being higher than the dielectric constant of the porous dielectric material;
    wherein said plurality of structures formed in the insulting layer provides mechanical reinforcement of the porous dielectric material which makes up the bulk of an inter-layer dielectric material;
    polishing the porous dielectric material such that a top surface thereof is substantially even oth the top surfaces of the structures; and
    after polishing said porous dielectric material, forming an inlaid metal interconnection in the porous dielectric material.

11. The process of claim 10, further comprising treating the porous dielectric material such that its void fraction is increased.

* * * * *

UNITED STATES PATENT AND TRADEMARK OFFICE
CERTIFICATE OF CORRECTION

| | |
|---|---|
| PATENT NO. | : 6,984,581 B2 |
| APPLICATION NO. | : 09/745705 |
| DATED | : January 10, 2006 |
| INVENTOR(S) | : Wong |

Page 1 of 1

It is certified that error appears in the above-identified patent and that said Letters Patent is hereby corrected as shown below:

Column 8, at line 58, delete "oth" and insert --with--.

Signed and Sealed this

Fourth Day of December, 2007

JON W. DUDAS
*Director of the United States Patent and Trademark Office*